United States Patent [19]

Cambier

[11] Patent Number: 5,107,151
[45] Date of Patent: Apr. 21, 1992

[54] SWITCHING CIRCUIT EMPLOYING ELECTRONIC DEVICES IN SERIES WITH AN INDUCTOR TO AVOID COMMUTATION BREAKDOWN AND EXTENDING THE CURRENT RANGE OF SWITCHING CIRCUITS BY USING IGBT DEVICES IN PLACE OF MOSFETS

[75] Inventor: Craig S. Cambier, Louisville, Colo.

[73] Assignee: Unique Mobility, Inc., Englewood, Colo.

[21] Appl. No.: 530,793

[22] Filed: May 30, 1990

Related U.S. Application Data

[63] Continuation-in-part of Ser. No. 396,636, Aug. 22, 1989.

[51] Int. Cl.[5] .............................. H03K 17/60
[52] U.S. Cl. .................... 307/570; 307/263; 307/571; 363/16
[58] Field of Search ............ 307/263, 443, 446, 570, 307/571; 363/55, 56, 16, 132, 140

[56] References Cited

U.S. PATENT DOCUMENTS

| | | | |
|---|---|---|---|
| 4,301,496 | 11/1981 | Schwarz | 363/132 |
| 4,594,650 | 6/1986 | Kinbara | 363/132 |
| 4,626,715 | 12/1986 | Ishii | 307/571 |
| 4,721,869 | 1/1988 | Okado | 307/570 |
| 4,742,208 | 5/1988 | Overman | 363/56 |
| 4,745,537 | 5/1988 | Cheung | 363/56 |
| 4,754,385 | 6/1988 | McDade et al. | 363/16 |
| 4,768,141 | 8/1988 | Hubertus et al. | 363/56 |
| 4,805,079 | 2/1989 | Van Buul | 363/132 |
| 4,853,832 | 4/1989 | Stuart | 363/56 |
| 4,876,635 | 10/1989 | Park et al. | 363/56 |
| 4,926,302 | 5/1990 | Harada et al. | 363/16 |
| 4,933,621 | 6/1990 | MacMinn et al. | 363/132 |
| 4,937,725 | 6/1990 | Phyanchand et al. | 363/56 |
| 5,019,770 | 5/1991 | Harada et al. | 363/16 |

FOREIGN PATENT DOCUMENTS

| | | | |
|---|---|---|---|
| 3233204 | 3/1983 | Fed. Rep. of Germany | 363/16 |
| 3316251 | 11/1984 | Fed. Rep. of Germany | 363/16 |
| 0625369 | 9/1981 | France | 363/56 |
| 0032525 | 3/1977 | Japan | 363/16 |

Primary Examiner—Stanley D. Miller
Assistant Examiner—Terry D. Cunningham
Attorney, Agent, or Firm—Stevens, Davis, Miller & Mosher

[57] ABSTRACT

A switching circuit is provided which is to be connected to a power source. The circuit includes a first device, an inductor and a second device, all connected in series. Either a single inductor or a pair of series-connected inductors is connected in series between the first and second devices. One or both of the first and second devices are switched on and off to supply a load with an output voltage. The circuit can also include diodes to prevent harmful reverse current flow and to provide bypasses around the first and second devices. The first and second devices can be semiconductor elements, such as FETs, and particularly MOSFETs. The first device can be an IGBT.

11 Claims, 6 Drawing Sheets

SWITCHING CIRCUIT EMPLOYING ELECTRONIC DEVICES IN SERIES WITH AN INDUCTOR TO AVOID COMMUTATION BREAKDOWN AND EXTENDING THE CURRENT RANGE OF SWITCHING CIRCUITS BY USING IGBT DEVICES IN PLACE OF MOSFETS

This is a continuation-in-part of co-pending Ser. No. 07/396,636 filed Aug. 22, 1989.

FIELD OF THE INVENTION

The invention relates to switching circuits for power devices, such as those for use in controllers for brushless motors, DC/AC inverters, switching power amplifiers or the like. More particularly, the invention employs an insulated gate bipolar transistor (IGBT) as the upper electronic device in a switching circuit.

BACKGROUND OF THE INVENTION

Many power circuits used for control or conversion of large amounts of power require that two switches be connected in series across a bulk voltage bus. This allows the chopping of a DC level into an alternating voltage for driving some form of load with inductive characteristics that are inherent in the load or are parasitic components of the connection to the load. Many concerns must be addressed when using this type of circuit. Error in the control of such a power stage can result in very high power loss in the commutating switch device. These measures involve the elimination of simultaneous conduction of the upper and lower switch stages caused by a variety of voltage and current slew rates interacting with either the power device or the control circuit through some stray capacitive or magnetic coupling. Many of these techniques are well understood and have brought about the widespread use of bridge circuits in high power applications.

The introduction of power MOSFET devices (defined herein as an electronic part that contains one or more active elements, such as a transistor or integrated circuit) has led to a new set of concerns with the parasitic source-to-drain diode that is inherent in the MOSFET's fabrication. The problem is referred to as the "dv/dt" problem or "commutating SOA"(safe operating area). Under most circumstances or circuit topologies, the dynamic dv/dt problem is simply not a problem. The condition under which concern is warranted is when the load has inductive characteristics with a lagging current and the current does not reverse within the period of the switching cycle.

Examples of circuits with potential commutation problems are PWM brushless motor controllers, DC-AC inverters that construct AC waveforms of much lower frequency than the switching frequency, and switching power amplifiers. These circuits have the condition where the parasitic diode in the MOSFET device may never come out of conduction before the other device turns on again, which leads to a reverse recovery of the conduction parasitic diode. The high level of current, combined with the high level of voltage across the device toward the end of the recovery (when the current is highest), causes what is known as dv/dt failure.

Figure 1:
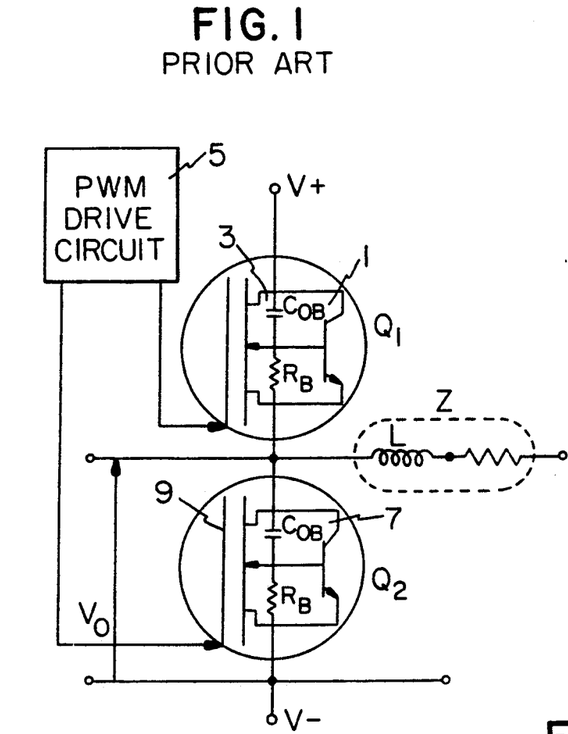
FIG. 1 illustrates a prior art switching circuit employing a pair of devices $Q_1$ and $Q_2$.
Figure 2:
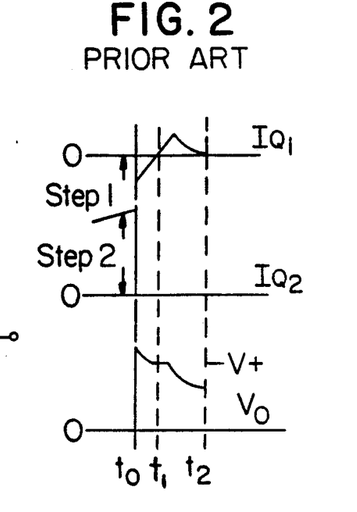
FIG. 2 illustrates the currents in the two devices and the output voltage at the load at various times in the switching cycle.

The parasitic diode in the power MOSFET is actually the base-collector junction of a parasitic bipolar transistor that exists due to the fabrication of the power MOSFET. This parasitic bipolar transistor 1 is in parallel with FET 3 as shown in $Q_1$ in FIG. 1. The upper and lower devices, $Q_1$ and $Q_2$, are switched with pulse-width-modulated drive circuit 5 to control the bus voltage applied to a load Z. When one device $Q_2$ is switched OFF at $t_o$, current flows in the upper device $Q_1$ in the manner shown in the waveforms of FIG. 2. The inductive fly-back causes the voltage at the load terminal to exceed the positive rail voltage. This would force current into resistor $R_{B1}$ and the base-to-collector diode of the parasitic transistor 1 of $Q_1$ and back into the positive rail. The slew rate of the voltage can be determined from the following relationship:

$$\frac{dv}{dt} = \frac{I}{C} \qquad (1)$$

The recovery period starts at $t_1$ as the base of the parasitic transistor 1 becomes sufficiently charge with minority-carriers (from the collector) and with the discharge current (from $C_{OB}$). The base-emitter junction becomes forward biased at this point, and the conditions for a secondary breakdown at $t_2$ are set. A significantly more serious situation can arise if the lower device $Q_2$ is switched on at $t_1$. The bulk supply voltage would then be applied across the two conducting devices $Q_1$ and $Q_2$ causing an extremely high di/dt to be experienced by them and resulting in possible failure of one or both. The resistance in this $Q_1$ is the base-emitter $R_{B1}$ of the parasitic transistor 1 which is required to be as small as possible to avoid forward biasing the transistor. However, the low value of $R_{B1}$ actually increases the di/dt that can be experienced by the devices $Q_1$ and $Q_2$.

Hence, even though the problem is commonly known as a dv/dt problem, it is equally as much a di/dt problem.

Since this unique failure mode was identified, several solutions have been suggested. The following are representative One proposed solution is to use devices that are rated at voltages significantly higher than the bus voltage. The $R_{DS}(on)$ of MOSFET devices tends to increase with voltage rating, resulting in a serious penalty. It should also be noted that the breakdown voltage $BV_{CEO}$ of the parasitic transistors is about half of the corresponding $BV_{DSS}$ of the MOSFET device.

Figure 3:
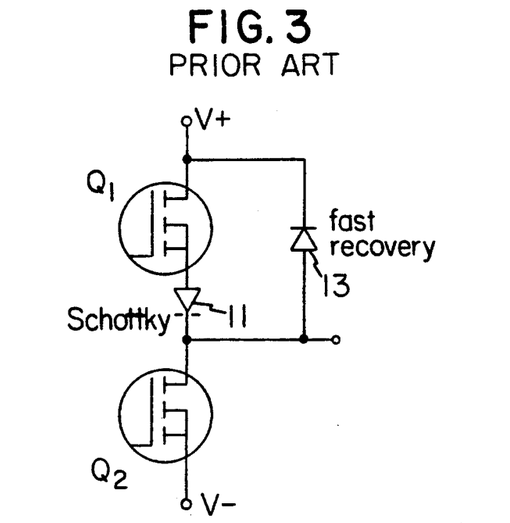
FIGS. 3 and 4 illustrate additional prior art switching circuits.

Another proposal illustrated in FIG. 3 is to add a Schottky rectifier diode 11 in series with $Q_1$ and $Q_2$ and a fast recovery diode 13 in reverse parallel to $Q_1$ and Schottky combination. Unfortunately, the addition of Schottky diode 11 adds power loss to the other losses at load current and reduces the efficiency of the circuit. A possible problem can still result from the current fed by the high capacitance of the Schottky diode 11 into $Q_1$ during the flyback period to $t_f$.

Figure 4:
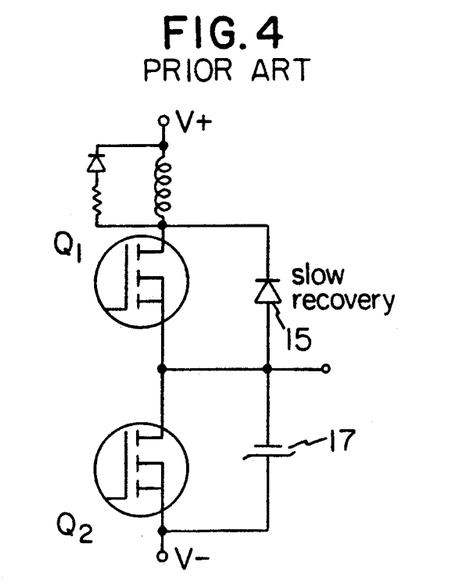

Another proposal illustrated in FIG. 4 is to add a slow recovery diode 15 in series with an external voltage source 17. However, the penalty of additional parts and voltage source 17 is a significant factor in this scheme.

Many methods have been proposed for control of the above detrimental effects on MOSFET devices, but heretofore none have offered a quantitative design tool providing predictable control.

Another problem is extending the current range of the switching circuit when operating voltages exceed approximately 200 volts. The forward resistance of the device is one of the factors which determine the current load capacity. If the forward resistance is reduced, the current load capacity is increased.

SUMMARY OF THE INVENTION

The object of this invention is to provide such a tool overcoming the above problems, and particularly, for use in a DC/AC inverter, switching power amplifier, PWM brushless motor controller or the like.

According to the invention, a switching circuit is provided which is adapted to be connected to a power source having a high voltage rail and a low voltage rail. The switching circuit includes a first device, a first inductor, a second inductor and a second device, all of which are connected in series with one another to form a first junction between the first device and the first inductor, a second junction between the first inductor and the second inductor and a third junction between the second inductor and the second device. The first device includes a terminal adapted to be connected to the high voltage rail and the second device includes a terminal adapted to be connected to the low voltage rail, such that the first and second devices can be connected in series with the power source. The circuit can also include a first diode connected between said terminal of the second device and the first junction to prevent harmful reverse current flow and to provide a bypass around the second device which is not yet turned on while the first device is just turned off, and a second diode connected between the third junction and said terminal of the first device to perform the same function as the first diode but with respect to the first device. The circuit also includes means for switching the first and second devices alternately such that a load connected to the second junction is supplied with an output voltage.

Also, according to the invention, a switching circuit is provided which is adapted to be connected to a power source having a high voltage rail and a low voltage rail. The switching circuit includes a first device, an inductor and a second device, all connected in series with one another to form a first junction between the first device and the inductor and a second junction between the inductor and the second device. The first device includes a terminal adapted to be connected to the high voltage rail and the second device includes a terminal adapted to be connected to the low voltage rail, such that the first and second devices can be connected in series with the power source. The circuit can also include a first diode connected between said terminal of the second device and the first junction and a second diode connected between the second junction and said terminal of the first device. The circuit also includes means for switching the first or second device or both devices on and off such that a load connected to either the first or second junction is supplied with an output voltage.

In each of the above embodiments, the first and second devices can be current control elements such as semiconductor elements, e.g., FETs, particularly MOSFET devices. The switching circuit can be employed, e.g., in a DC/AC inverter or the like.

In another embodiment, the first device can be an insulated gate bipolar transistor (IGBT). The first device can include a third diode that is connected between the terminal of the first device and the first junction to prevent harmful reverse current flow.

The invention is based on the concept of controlling the dv/dt rate of the capacitor of a parasitic transistor (when the devices are FETs) by delaying the charging until the current is at a reduced value. The invention also involves the concept of controlling the di/dt rate through the device by providing an inductor in series with the device. The diodes function as catch diodes to divert the flyback current from the device.

BRIEF DESCRIPTION OF THE DRAWINGS

The above and other objects, features, and advantages of the invention will be more fully apparent from the following detailed description considered in conjunction with the attached drawings, of which.

DETAILED DESCRIPTION OF THE PREFERRED EMBODIMENTS

Figure 5:
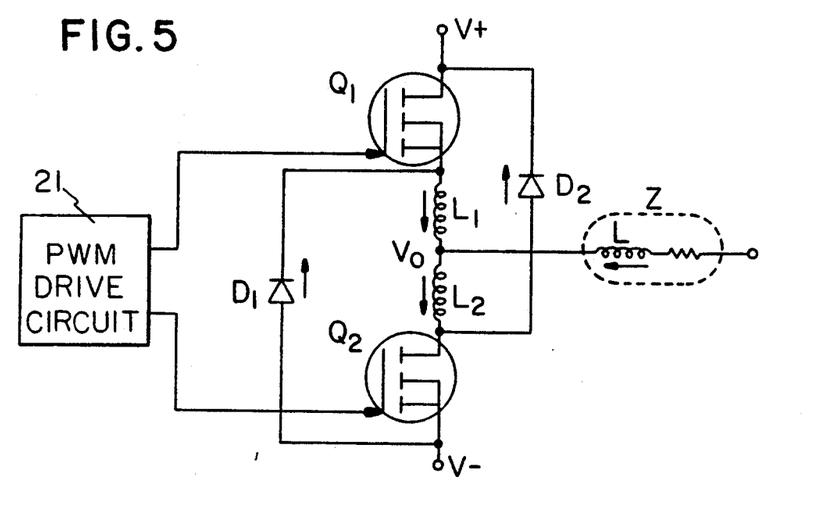
FIG. 5 shows a first embodiment of a switching circuit according to the invention.
Figure 6:
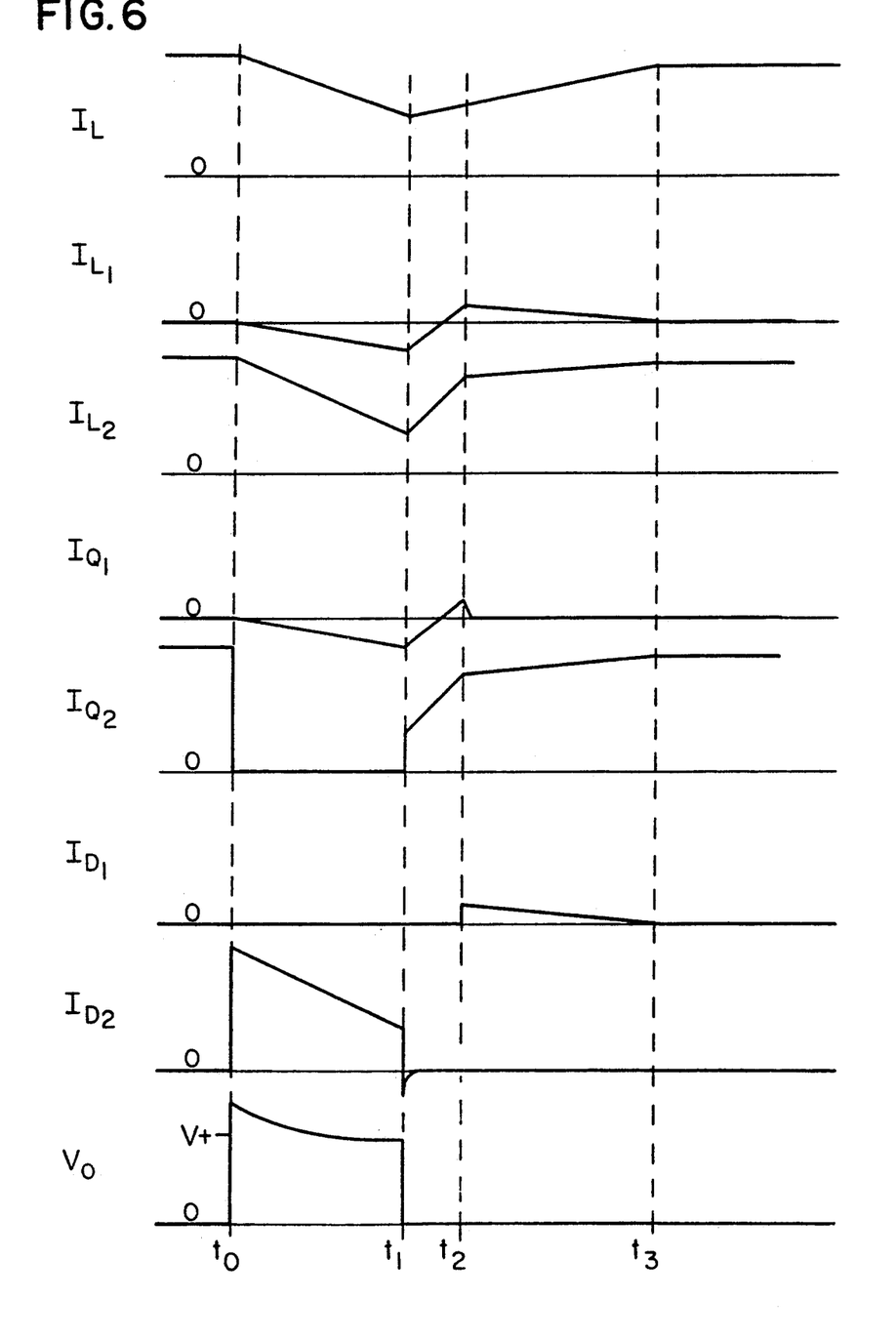
FIG. 6 illustrates the device currents and output voltages at various times in the switching cycle of the FIG. 5 and FIG. 8 circuits.
Figure 10:
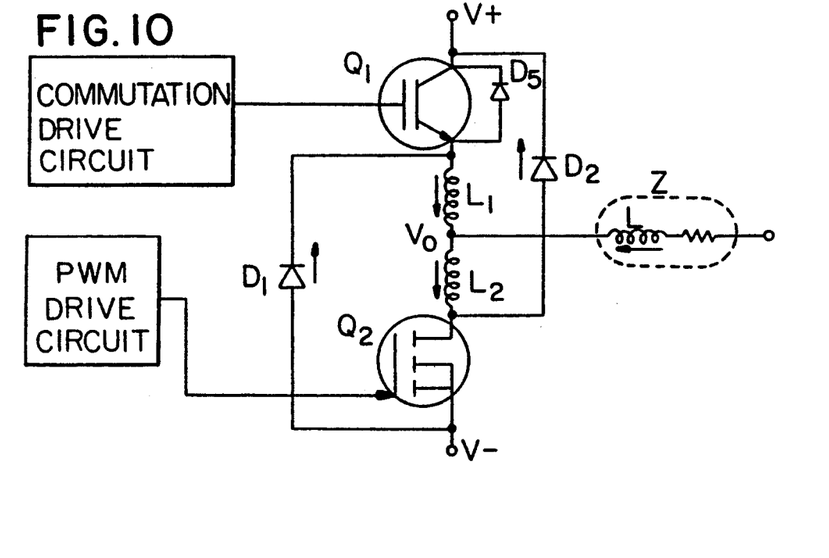
FIGS. 10-12 illustrate the fifth, sixth and seventh embodiments of a switching circuit according to the invention.

The present invention uses an inductive technique to control di/dt. FIG. 5 shows a configuration of two devices $Q_1$ and $Q_2$, identical to devices $Q_1$ and $Q_2$ in FIGS. 1, 3 and 4, forming a half bridge separated by two inductors. Two diodes D1 and D2 of voltage and current ratings similar to those of devices $Q_1$ and $Q_2$ are part of the new concept also. The directions of current shown in different parts of the circuit are assumed to be the positive directions. FIGS. 6 and 10 show the waveforms of current through devices $Q_1$ and $Q_2$ and diodes D1 and D2 at turn-on and turn-off.

When $Q_2$ is turned off at to, the load current $I_L$ continues to flow but in a different path. This path is through inductor $L_2$ and diode $D_2$ since the current in $L_2$ also will want to continue to flow. In time, however, the voltage across $L_2$ will decrease sufficiently to allow part of the load current $I_L$ to flow through $L_1$ and the parasitic transistor of $Q_1$ This current $IQ_1$ will be carried by RB and the base-to-collector diode.

At $t_1$, the lower device $Q_2$ is switched on again. However, the conditions described above that give rise to the failure of MOSFET devices also exist at $t_1$. However, the presence of $L_1$ and $L_2$ in the circuit of FIG. 5 makes a significant difference to the events that follow. The current in $Q_1$ is actually the current that will flow in the parasitic transistor of $Q_1$. The slew of this current is now controlled and predictable from the following equation:

$$\frac{di}{dt} = \frac{V}{L_1 + L_2} \quad (2)$$

The two inductors should be capable of operating at full load current without saturation. The safe value of di/dt for a particular circuit depends on a number of parameters, specifically, the device rating and operating temperature.

By $t_2$, device $Q_1$ would have recovered safely from the conduction of its parasitic transistor. Between $t_2$ and $t_3$, inductor $L_1$ dissipates its energy in the loop formed by $Q_2$ and $D_1$.

In the circuit of FIG. 5, the drive signals supplied by PWM drive circuit 21 to both $Q_1$ and $Q_2$ are modulated at a high frequency. This means continuous switching which may be, e.g., PWM switching, of both devices during their corresponding conduction periods. Two inductors are supplied between $Q_1$ and $Q_2$. The load is connected between the two inductors ensuring that there is one inductor in the circuit of each device as it is switching.

Figure 7A:
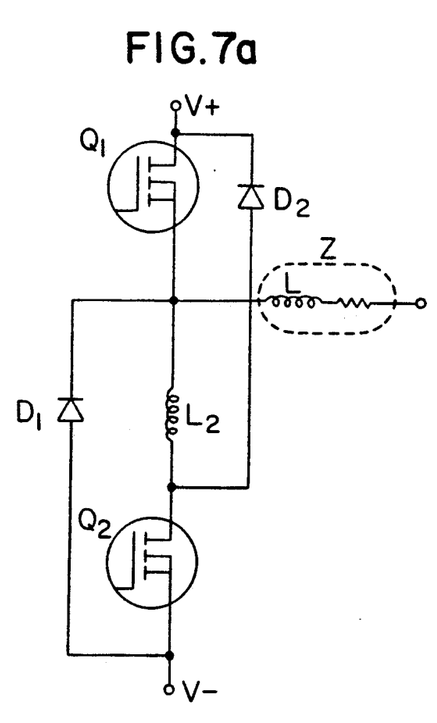
FIGS. 7a and 7b illustrate second and third embodiments of a switching circuit according to the invention.
Figure 7B:
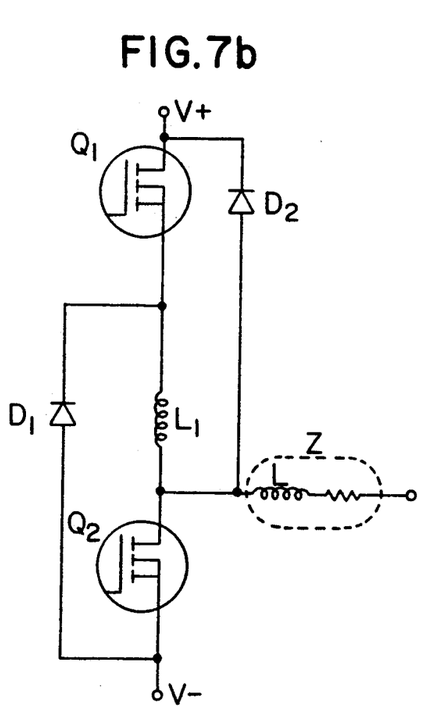

However, it is also possible in some circuits to switch only one device, i.e. upper or lower. These two alternatives are shown in FIGS. 7a and 7b. The analysis of the events at the time of switching is similar to that of FIG. 6 for the circuit of FIG. 5 which illustrates the general concept underlying the present invention. The differences relate to the following items.

First, for the circuit in FIG. 7a, $I_{L1}$ does not exist and $L_2$ carries the total load current between $t_o$ and $t_2$.

Secondly, for the circuit in FIG. 7b, $IL_2$ does not exist and $L_1$ carries the total load current between $t_o$ and $t_2$.

In both circuits of FIGS. 7a and 7b, the inductor plays its most critical role at $t_2$ by limiting di/dt to a predictable value as shown by above Equation 2. The peak value of current reached by $t_3$ is a fraction of the load current because of this controlled slew rate. Hence, in a certain configuration, the inductor need not be designed with a saturation level at high values of current. This would be device $Q_1$ and by using the circuit of FIG. 7b when switching device $Q_2$. This results in a significant reduction in the size of the inductor.

In the circuits of FIGS. 5, 7a and 7b, the drive signals that are supplied from the PWM drive circuits 21 to both switching devices $Q_1$ and $Q_2$ are operated at the same high frequency to control the circuit. This high frequency is superimposed on a low commutation frequency. The devices $Q_1$ and $Q_2$ are switched on and off many times within a period that is determined by the lower commutation frequency. This commutation frequency is dependent on the transducer speed and the number of poles.

Using a MOSFET as $Q_1$ and $Q_2$ allows efficient control of the circuit. The high frequency is not necessarily applied to the upper device $Q_1$. Eliminating the high frequency from the upper device results in an unexpected advantage. This advantage is the removal of the requirement of a MOSFET device at the upper device $Q_1$. A MOSFET is still required at the lower device $Q_2$ because of the requirement of low conduction losses and fast switching times. As a result, the upper device $Q_1$ can be an IGBT. The MOSFET in the upper device $Q_1$ is no longer require for efficient operation. Using an IGBT has several advantages. In contrast to a MOSFET, an IGBT permits a higher current for a particular junction temperature. The IGBT's forward voltage drop at a given current for approximately 200 volts and higher is lower than the MOSFET's forward voltage drop. Since this forward voltage drop determines the current load capacity, the IGBT can have a higher current load capacity. These two factors, the higher current for a particular junction temperature and the lower forward voltage drop, result in overall higher current load capacity. The switch-off safe operating areas (SOAR) of the IGBT and the MOSFET are rectangular. The IGBT's SOAR is equal to or is slightly less than the MOSFET's SOAR. The losses that are associated with the higher switching off times of the IGBT are negligible compared to total device losses because the IGBT is operated at the lower commutation frequency.

Figure 9:
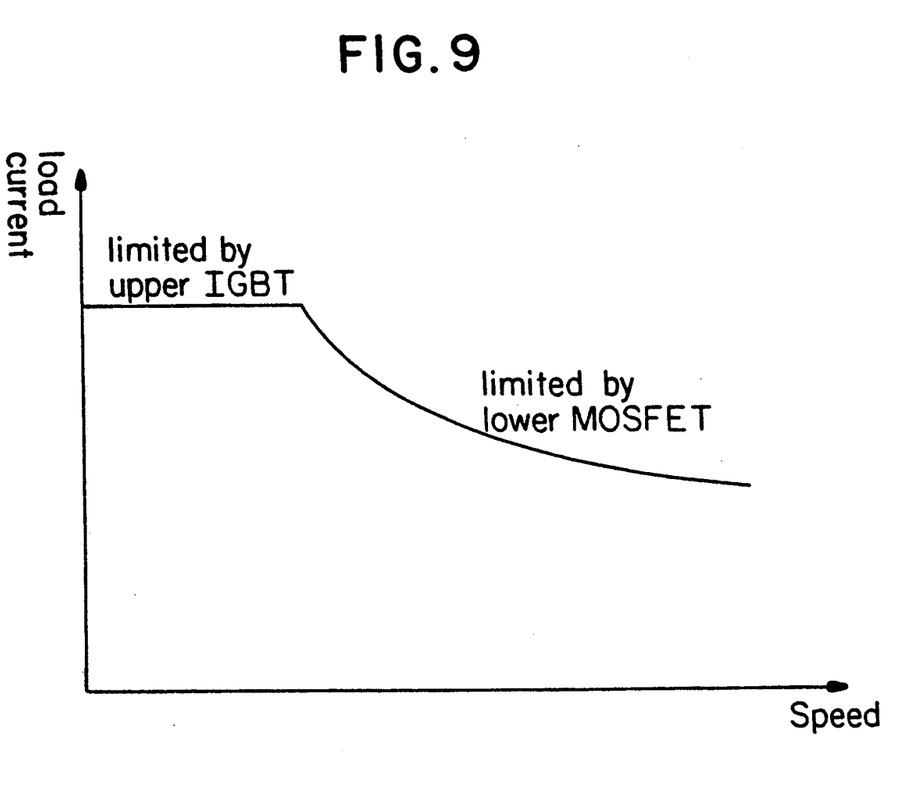
FIG. 9 illustrates the drive characteristics of the IGBT in the fourth embodiment.

The use of an IGBT in the upper device $Q_1$ is especially advantageous at low speeds. As FIG. 9 illustrates, the load current is determined by the thermal limitations of the upper circuits. The increase in current capacity at low speeds can be 100% of the current capacity without the IGBT. This increase is important in applications where the demand for power, which is directly related to current, is greater at low speeds than at high speeds, e.g. an electric vehicle. As FIG. 9 illustrates, the load current of the drive circuit at high speeds is determined by the thermal limitations of the lower device which is a MOSFET. Thus at high speeds, the load current is not increased.

Figure 8:
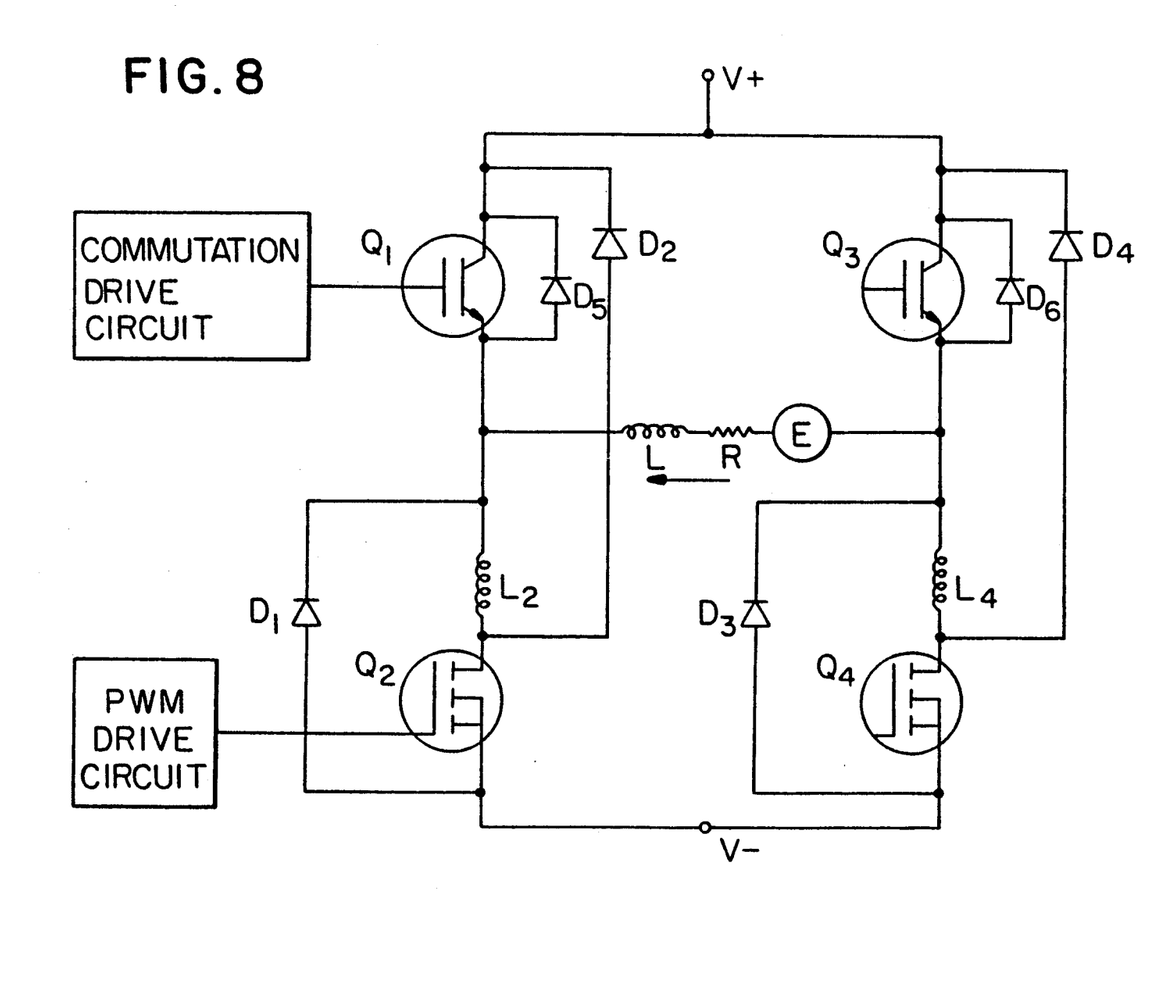
FIG. 8 illustrates the fourth embodiment of a switching circuit according to the invention.
Figure 11:
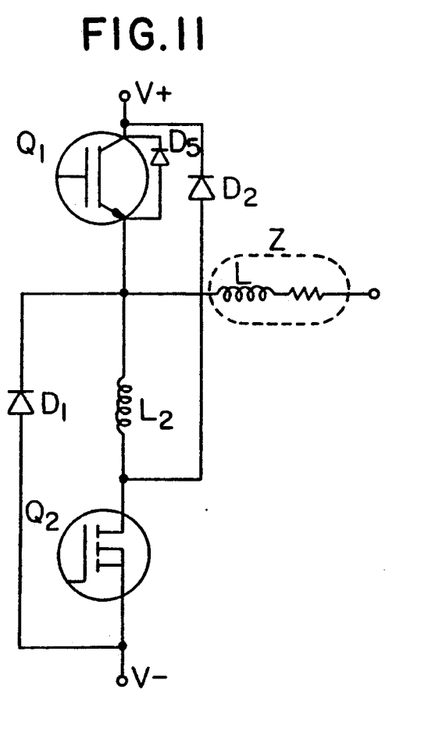
Figure 12:
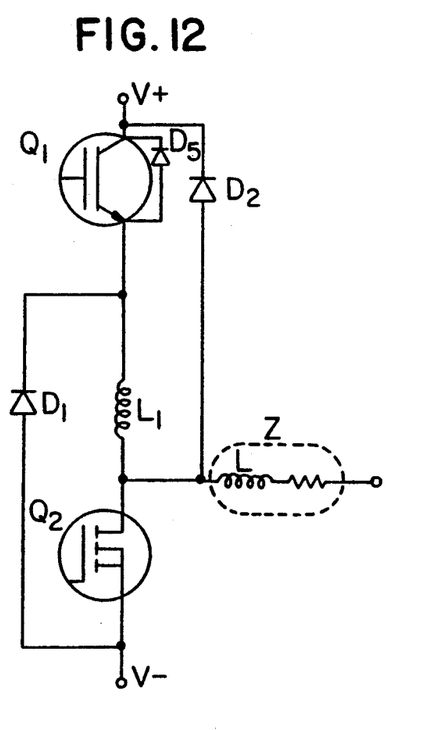

As seen in FIGS. 10 to 12, the IGBT replaces the MOSFET as the upper device $Q_1$ of FIGS. 5, 7a and 7b respectively. As seen in FIG. 8, diodes $D_5$ and $D_6$ are connected across the IGBTs in reverse parallel. The additional P layer at the collector creates a virtual diode of low blocking voltage which could be damaged by reverse bias conditions. The diodes $D_5$ and $D_6$ protect the IGBTs from a reverse bias which could damage the IGBTs. Additionally, if the current through an IGBT exceeds a predetermined value, the IGBT's operating characteristics change and become similar to a Silicon Controlled Rectifier (SCR). Specifically, the IGBT's gate loses control of the ability to turn the IGBT off. This loss of control can be prevented by additional circuitry (not shown).

The IGBT and the MOSFET are compatible in their drive circuit requirements. This compatibility makes the two devices interchangeable in power circuits.

The following are two important aspects of the present invention with respect to the illustrated embodiments:

(1) controlling the dv/dt rate at the capacitor of the parasitic transistor of $Q_1$ to a magnitude below a predetermined threshold by delaying charging of the capacitor until a predetermined time $t_2$ after $Q_2$ has been switched on when the current in $Q_1$ is at a reduced value; and (2) controlling the di/dt rate through $Q_1$ to a magnitude below a given threshold at a predetermined time $t_2$ after $t_1$, by providing the inductor in series with the FET.

In addition, there is an advantage in using the catch diodes $D_1$ and $D_2$ to divert the flyback current from the device. This feature, in fact, contributes to aspect (1) above by controlling dv/dt.

It should be noted that the switching circuit, according to the invention, can be employed in an electric motor controller (e.g., a PWM brushless motor controller), DC/AC inverters, switching power amplifiers, or the like.

It should be noted that the above description, and the accompanying drawings, are merely illustrative of the application of the principles of the present invention and are not limiting. Numerous other arrangements which embody the principles of the invention and which fall within its spirit and scope may be readily devised by those skilled in the art.

I claim:

1. A switching circuit employing semiconductor devices in series with an inductor to avoid commutation breakdown and extending the current range of switching by using IGBT devices, said circuit for connecting to a power source having a high voltage rail and a low voltage rail, said circuit comprising:
   a first semiconductor device comprising an insulated gate bipolar transistor;
   a first inductor;
   a second inductor;
   a second semiconductor device;
   said first semiconductor device having an emitter connected to a first node, said first inductor connected at one end to said first node, said first inductor connected at a second end to a second node, said second inductor connected at one end to said second node, said second inductor connected at a second end to a third node, said second semiconductor device having a drain connected to said third node; and
   means for switching said first and second semiconductor devices each at a different rate, said switching means connected to a gate of said first and second semiconductor devices, respectively, such that when said circuit is connected to said power source by a source of said second semiconductor device being connected to said low voltage rail at a fourth node, and a collector of said first semiconductor device being connected to said high voltage rail at a fifth node, a load connected to said second node is supplied with an output voltage.

2. The circuit as in claim 1, wherein said circuit further comprises a first diode having an anode connected to said fourth node and a cathode connected to said first node to prevent harmful reverse current and to provide a bypass around said second semiconductor device which is not yet turned on while said first semiconductor device is just turned off and a second diode having an anode connected to said third node and a cathode connected to said fifth node to prevent harmful reverse current and to provide a bypass around said first semiconductor device which is not yet turned on while said second semiconductor device is just turned off.

3. The circuit as in claim 1, wherein said switching means includes means for controlling the first and second semiconductor devices, said means for controlling having a first frequency and a second frequency, said second frequency being greater than said first frequency.

4. The circuit as in claim 3, wherein said first frequency is a commutation frequency.

5. The circuit as in claim 3, wherein said second frequency is a pulse width modulation frequency.

6. The circuit as in claim 2, wherein said circuit further comprises a third diode connected between said of the first device and said fifth and first nodes.

7. The circuit as in claim 1, wherein said semiconductor element is a FET.

8. The circuit as in claim 1, wherein said FET is a MOSFET.

9. A switching circuit employing semiconductor devices in series with an inductor to avoid commutation breakdown and extending the current range of switching by using IGBT devices, said circuit for connecting to a power source having a high voltage rail and a low voltage rail, said circuit comprising:
   a first semiconductor device comprising an insulated gate bipolar transistor;
   an inductor;
   a second semiconductor device;
   said first semiconductor device having an emitter connected to a first node, a collector of said first semiconductor device connected to a second node; said inductor connected at one end to said first node, said inductor connected at a second end to a third node; said second semiconductor device having a drain connected to said third node, a source of said second semiconductor device connected to a fourth node;
   said circuit further comprising a first diode having an anode connected to said fourth node, a cathode of said first diode connected to said first node; a second diode having an anode connected to said third node, a cathode of said second diode connected to said second node; when means are connected to gates of said first nd second semiconductor devices for alternately switching said first semiconductor device on and off, a load connected, at a first end, to one of said first node and said third node is supplied with an output voltage when said high voltage rail is applied to said second node, and said low voltage rail is applied to said fourth node and to a second end of said load.

10. The circuit as in claim 9, wherein said semiconductor element is a FET.

11. The circuit as in claim 9, wherein said FET is a MOSFET.

* * * * *